United States Patent [19]

Tsumura et al.

[11] Patent Number: 4,631,110
[45] Date of Patent: Dec. 23, 1986

[54] PEELING TYPE DEVELOPING APPARATUS

[75] Inventors: Akio Tsumura; Shun-ichi Hayashi; Chiharu Miyaake; Kazuo Oouchi; Yutaka Yamamura, all of Osaka, Japan

[73] Assignee: Nitto Electric Industrial Co., Ltd., Japan

[21] Appl. No.: 758,985

[22] Filed: Jul. 25, 1985

[51] Int. Cl.$^4$ ............................................. B32B 31/16
[52] U.S. Cl. ..................................... 156/584; 156/344; 430/256
[58] Field of Search ................. 156/344, 584; 354/354; 430/253, 256

[56] References Cited

U.S. PATENT DOCUMENTS 4,165,251  8/1979  Matsumoto et al. ................. 156/584
4,183,751  1/1980  Matsumoto et al. ............ 156/584 X
4,285,759  8/1981  Allen et al. ........................... 156/584
4,504,571  3/1985  Yamamura et al. ................ 430/253
4,508,589  4/1985  Tarui et al. .......................... 156/584

Primary Examiner—Robert A. Dawson
Attorney, Agent, or Firm—Sughrue, Mion, Zinn, Macpeak and Seas

[57] ABSTRACT

A peeling type developing method and apparatus for removing exposed photoresist from printed circuit boards. The printed circuit board is covered with a photopolymerization compound layer and then a transparent support layer. After exposure, a thin adhesive tape is stuck to the support layer extending obliquely across the board and crossing opposite corners thereof. The adhesive tape, together with the support layer and the unexposed portions of the photoresist material, are peeled off the printed circuit board by a pair of pinch rolls with the aid of a peeling bar in line contact with the substrate through the adhesive tape and the support layer.

7 Claims, 14 Drawing Figures

PEELING TYPE DEVELOPING APPARATUS

BACKGROUND OF THE INVENTION

The present invention relates to a peeling type developing method which is utilized for manufacturing printed circuit boards or the like.

In order to manufacture printed printed circuit boards, an image forming apparatus has been proposed in the art in which an image forming material, made of a transparent support and a photopolymerization compound layer formed on the support, is adhered to a surface of an image forming substrate in such a manner that the photopolymerization compound layer is in contact with the substrate. The photopolymerization compound layer is then exposed, thus forming hardened regions therein. After heating the image forming material as necessary, the support and the unexposed parts of the photopolymerization compound layer are peeled from the substrate so that a resist pattern in the image of the desired wiring pattern is formed on the substrate.

When the above-described peeling type developing method is employed, a key point for obtaining images of excellent quality resides in the way in which peeling of the image forming material is effected.

The present inventors have previously proposed a method for peeling off the image forming material in which the peeling operation is carried out by sticking a long piece of adhesive tape to the support which is formed on the substrate, thereby providing an economical and efficient peeling method in which the support is peeled from the corner of the substrate by using a piece of adhesive tape of small width.

FIGS. 1 through 3 illustrate the above-described peeling method. In these figures, reference numeral 1 designates a substrate; and 2, an image forming material layer adhered to the main surface of the substrate 1. The layer 2 is formed of a photopolymerization compound layer 3 and a transparent support 4. Further in FIG. 1, reference numeral 5 designates a pressing and peeling roll; and 6, a nip roll. These rolls peel the support 4 together with unexposed parts 3b of the photopolymerization compound layer 3 off the substrate 1 with the aid of an adhesive tape 7 which is fed along the pressing and peeling roll 5. The adhesive tape 7 is made up of a base film 8 and an adhesive layer 9.

During peeling, the adhesive tape 7, the support 4, and the unexposed parts 3b of the photopolymerization compound layer 3 are laid on the cylindrical surface of the pressing and peeling roll 5, and in this operation, the peeling force applied to the support 4 depends on the difference between the adhesive force adhering the exposed part 3a to the substrate 1 and the adhesive force adhering the unexposed part 3b to the substrate 1.

If this peeling force becomes large abruptly, then the adhesive tape 7 may slip between the two rolls 5 and 6. Therefore, the adhesive tape 7 and the support 4 stuck thereon slacken as shown in FIG. 1; that is, the support 4 is not in continuous contact with the cylindrical surface of the roll 5. Thus, the support 4, etc., are peeled off while forming a very small angle $\alpha$ with the substrate as indicated in FIG. 1.

In this method of peeling off the support 4, etc., together with the adhesive tape by moving them along the pressing and peeling roll 5, the ratio in area of the exposed parts 3a to the unexposed parts 3b in the photopolymerization compound layer 3 changes with time during peeling; that is, the peeling speed is not uniform. Therefore, the following problems are involved:

(I) Because of the nonuniform peeling speed, some of the unexposed parts are not removed from the support.
(II) Some of the exposed parts are peeled off.
(III) The image formed by the exposed parts is uneven in contour, and hence low in resolution.
(IV) In the case of a through-hole substrate manufactured according to a so-called "tenting" method in which through-holes in the substrate are protected from an etching spray solution, the tenting film is broken.
(V) Errors in picking up the substrate occur frequently, especially in the case of a thin substrate.

When a substrate 1 having through-holes 10 manufactured according to the tenting method illustrated in FIG. 2 is processed by the above-described peeling type developing method, the peeling angle $\alpha$ is very small, and therefore the support 4 is peeled from the exposed part 3a of the photopolymerization compound layer 3 while providing a width W in the direction of peeling, and accordingly a high tensile force is applied to the exposed part 3a through the support 4. Therefore, the exposed part 3a' which, as shown in FIG. 3, is over the through-hole 10 and is not bonded to the substrate 1, may be peeled off with the support 4.

SUMMARY OF THE INVENTION

The invention is intended to solve the above-described problems. Specifically, an object of the invention is to provide a peeling type developing method in which, during the peeling type developing method in which, during the peeling type developing operation, the peeling speed is maintained uniform, exposed parts over the through-holes can be peeled off, and the support can be positively picked up.

In order to solve the above-described problems, according to the invention, an image forming material layer made of a transparent support with a photopolymerization compound layer thereon is formed on a surface of a substrate on which an image is to be formed. After patterned exposure of the image forming material layer, an adhesive tape is stuck onto the substrate in such a manner that the adhesive tape lies over a corner of the substrate. The adhesive tape is then pulled away from the substrate at a constant speed while moving over a peeling bar arranged in line-contact with the substrate through the adhesive tape and the picture forming material layer. Thus, the adhesive tape, the support and unexposed parts of the photopolymerization compound layer are peeled from the substrate and exposed parts of the photopolymerization compound layer remain on the substrate.

That is, after the image forming material layer is exposed in the form of a pattern, an adhesive tape is placed on the substrate in such a manner that it is laid over one corner of the substrate. Then, the substrate is passed through conveying pinch rolls so that the adhesive tape is stuck to the transparent support. Following this, the adhesive tape is pulled by a pair of take-up pinch rolls so that the adhesive tape and the transparent support are peeled off the corner of the substrate while moving them along a peeling bar, whereby the support and unexposed parts of a photopolymerization compound layer are peeled from the substrate while exposed parts of the photopolymerization compound layer are caused to remain on the substrate.

Further in accordance with the invention, a peeling type developing device is provided having a peeling force control system which operates to detect a support peeling width, which is equal to the length of a part of the transparent support which is in line contact with the peeling bar, and causes the pair of take-up pinch rolls to produce a tensile force according to the support peeling width thus detected.

That is, in accordance with an important aspect of the peeling type developing device of the invention, after the image forming material layer has been exposed in the form of a pattern, an adhesive tape is stuck to the square substrate in such a manner that it lies over corners of the substrate while the substrate is conveyed by a pair of substrate conveying pinch rolls, and the adhesive tape and the transparent support are pulled upwardly by a pair of take-up pinch rolls so that they are peeled from the substrate while being moved over a peeling bar. In this operation, a substrate peeling width, equal to the distance for which the peeling bar is in line contact with the support, is detected, and the tensile force of the taking pinch rolls is controlled according to the peeling width thus detected to maintain constant the peeling force per unit length of the peeling part. Thus, the transparent support is uniformly peeled off along the peeling bar.

DESCRIPTION OF THE PREFERRED EMBODIMENTS

Figure 1:
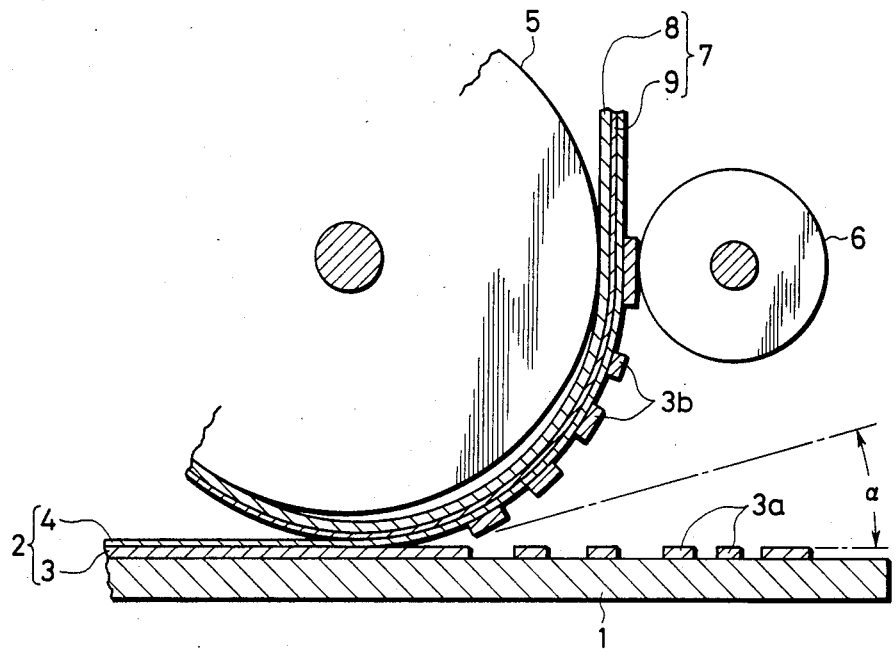
FIG. 1 is a schematic cross-sectional view of a conventional peeling type developing apparatus.
Figure 2:
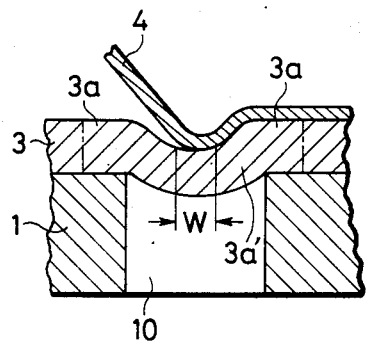
FIGS. 2 and 3 are cross-sectional view showing different states of a peeling part of a substrate having through-holes and which is processed by the apparatus of FIG. 1.
Figure 3:
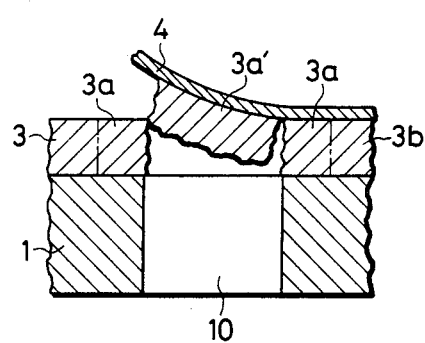
Figure 4:
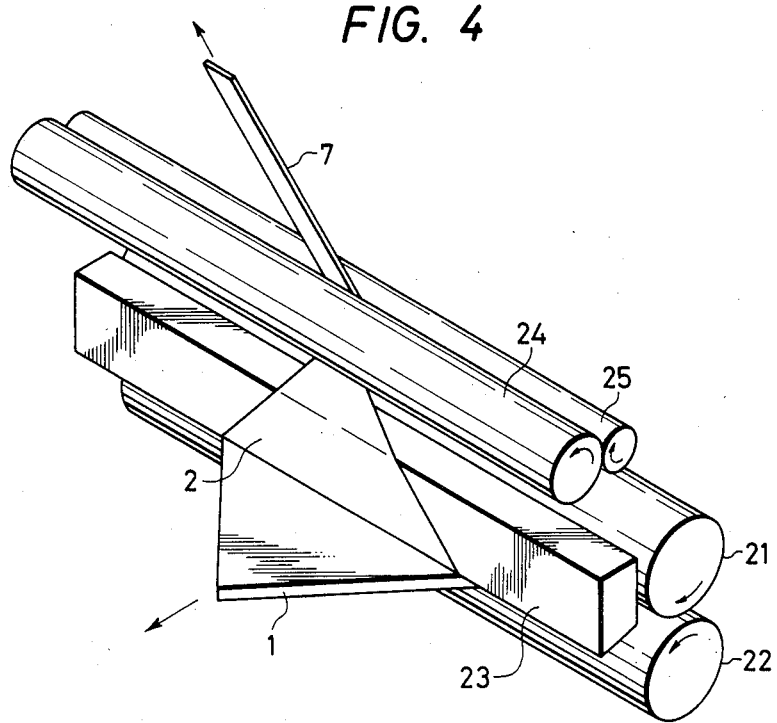
FIG. 4 is a perspective view of a peeling type developing device of the invention.

A preferred embodiment of the invention will be described with reference to FIGS. 4 through 7.

As shown in these figures, an image forming material 2 adhered to the main surface of a picture forming substrate 1 is formed of a photopolymerization compound layer 3 and a film-like transparent support 4 on which the layer 3 is formed.

After the photopolymerization compound layer 3 is exposed to form an image thereon, the transparent support 4 is peeled from the substrate 1. This peeling operation is carried out with a peeling device which operates to peel both an adhesive tape 7 (stuck to the support 4) and the support 4, as a unit, from the substrate 1.

Figure 5:
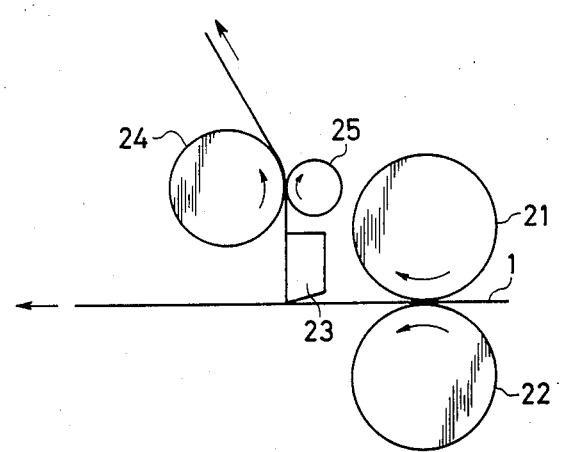
FIG. 5 is a side view of a portion of the apparatus of FIG. 4.
Figure 6:
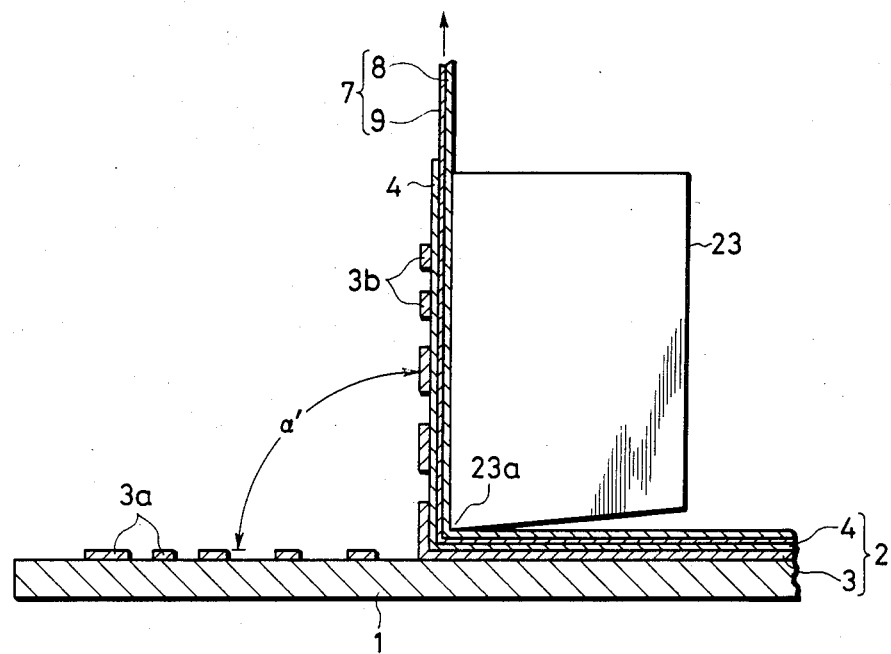
FIG. 6 is an enlarged sectional view showing portions of the apparatus of FIG. 4.

The peeling device is composed of a pair of conveying pinch rolls 21 and 22 arranged respectively above and below the conveying path of the substrate 1, a peeling bar 23 arranged in the direction of conveyance of the upper pinch roll 21 parallel to the latter, and a pair of take-up pinch rolls 24 and 24 arranged above the peeling bar 23. The substrate 1 is rectangular, and it is conveyed by the pinch rolls 21 and 22 with one corner at the top, as shown in FIG. 5.

The conveying pinch rolls 21 and 22 and the take-up pinch rolls 24 and 24 are independently driven by two motors (not shown) which are electrically controlled so that a ratio between the take-up speed of the take-up pinch rolls 24 and 25 and the conveying speed of the conveying rolls is kept constant. More specifically, the speed ratio between the rolls 24 and 25 (the ratio of the take-up speed to the substrate delivering speed) is in the range of 1.01 to 1.20, and more preferably in the range of 1.01 to 1.10.

Figure 7:
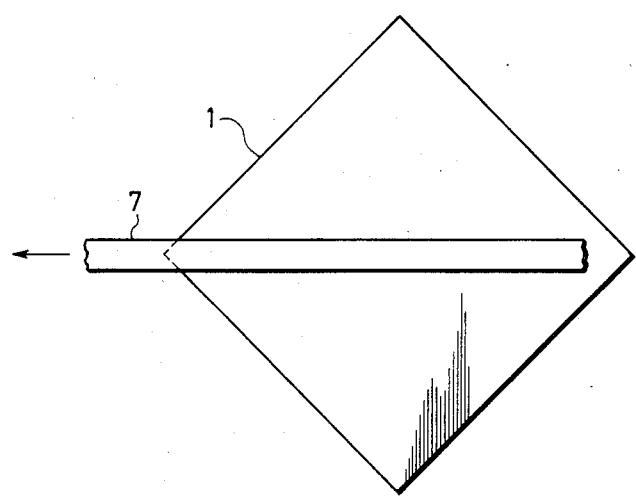
FIG. 7 is a plan view showing the positional relationship between the substrate and an adhesive tape.

The peeling adhesive tape 7 is pulled out of an adhesive tape supplying roll, and it is set on the transparent support 4 is such a manner that it crosses the aforementioned corner, as shown in FIG. 7. The adhesive tape 7 thus set is stuck to the transparent support 4 when passed through the pinch rollers 21 and 22 together with the substrate 1.

The peeling bar 23 is in the form of a quadrangular prism which extends along the axis of the pinch roll 21. The peeling bar 23 is arranged so that the corner part 23a of the peeling bar 23 is in line contact with the substrate 1 through the adhesive tape 7 and the picture forming material 2.

The adhesive tape 7 stuck to the transparent support 4 is pulled upwardly by the take-up pinch rollers 24 and 25 in such a manner that it is moved upwardly over the corner part 23a of the peeling bar 23. As a result, the adhesive tape 7 and the transparent support 4 are peeled from the substrate 1.

The angle of the corner part 23a of the peeling bar 23 and the positions of the take-up pinch rollers 24 and 25 are determined so that a peeling angle α formed between the support 4 and the substrate 1 is in the range of 30° to 150°.

In order to process a substrate on both sides of which image forming material layers are formed, a pair of peeling devices should be arranged respectively above and below the substrate conveying path. Furthermore, the peeling effect can be improved by heating the conveying pinch rollers 21 and 22 or the peeling bar 23.

With invention as described above, the substrate 1 on which the image forming material 2 has been formed and exposed is inserted between the pinch rolls 21 and 22 with the adhesive tape 7 set on the corner, as shown in FIG. 7. As a result, the adhesive tape 7 is stuck to the support 4. Thereafter, the adhesive tape 7 is pulled upwardly by the take-up pinch rollers 24 and 25 while passing directly under the peeling bar 23.

Accordingly, the adhesive tape 7, the support 4 and unexposed photopolymerization compound layers 3b are peeled from the substrate while moving along the peeling bar 23 at a uniform peeling speed. Thus, the peeling type developing operation has been accomplished.

In the developing operation, the support 4 is peeled off while moving along the peeling bar 23 as described above; that is, it is peeled off while in contact with the peeling bar 23. Thus the peeling speed of the support is uniform in its entire widthwise direction, and variations in the peeling speed are prevented.

Since the support 4 is peeled off while moving along the peeling bar 23, the peeling angle of the support 4 with respect to the substrate 1 can be relatively large. Therefore, even a substrate having through-holes manufactured according to the tenting method is free from the difficulty of the exposed parts of the photopolymerization compound layer which tent the through-hole parts being peeled off together with the support 4.

As is apparent from the above description, according to the invention, the support bearing the picture forming material is peeled off while being moved along the peeling bar. Accordingly, the peeling speed of the support is uniform in its entire widthwise direction, which prevents variations in the peeling speed. Thus, all the above-described difficulties attributed to a variable peeling speed are eliminated.

The peeling angle of the support can be large, as described above, which improves the peeling effect. For the same reason, even on a through-hole type substrate, clear images can be provided without damage to exposed parts.

Furthermore, because the adhesive tape is stuck on the substrate in such a manner that it is laid over the corner of the substrate, before it is peeled off, the support can be positively picked up.

Figure 10:
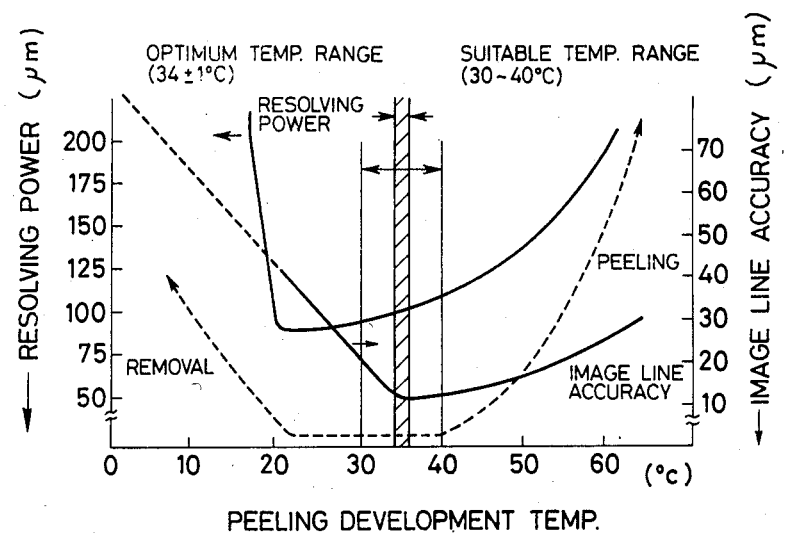
FIG. 10 is a graph showing measurement results of the effect of the peeling development temperature on several image characteristics of the resist pattern formed on the substrate using the peeling type developing device of FIG. 4.

In the above-described apparatus, the temperature at which the peeling operation is effected is an important factor which affects the final product. FIG. 10 shows measurement results of the effect of the peeling development temperature on the characteristics of resolving power (resolving accuracy), image line accuracy, and a peelability. As is apparent from FIG. 10, a suitable temperature range is 30° to 40° C. and more preferably, 34±1° C.

If the peeling operation is carried out at a temperature outside the suitable temperature range, the resolving power is reduced. In addition, the image line accuracy deteriorates so that the image line is not sharp. Also, the image resist can easily be accidentally peeled or removed.

Thus, according to the present invention, the pinch rollers 21 and 22 and the peeling bar 23 are preferably of the hollow type, and suitable heaters are disposed inside the rollers 21 and 22 and the peeling bar 23 so that the substrate 1 and the layer 2 are heated.

Temperature detecting sensors are arranged at suitable positions for the rollers 21 and 22 and the peeling bar 23 and the current supply to the heaters is controlled so as to maintain the suitable temperature range indicated in FIG. 10, more preferably at the optimum temperature range.

A further embodiment of the invention will be described with reference to FIGS. 8 and 9.

The conveying pinch rolls 21 are driven by a DC motor to convey the substrate 1 at a constant speed. The take-up pinch rolls 24 and 25 are also driven by a DC motor to take up the adhesive tape 7 and the transparent support 4 so that the tape and the support are peeled from the substrate 2 while moving over the peeling bar 23.

In accordance with this embodiment of the invention, the DC motor for the pinch rolls 24 and 25 is controlled by a peeling force control system so that the pinch rolls 24 and 25 provide a tensile force corresponding to the width of the part of the transparent support 4 which is currently peeled from the substrate 1 while in line contact with the peeling bar 23, whereby the peeling force per unit length of the peeled part which extends along the peeling bar 23 is made constant.

Figure 8:
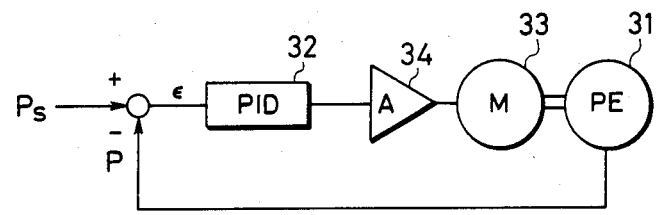
FIG. 8 is a block diagram of a system used to control a peeling force.

The inventive peeling force control system is arranged as shown in FIG. 8. In this system, the speed of a DC motor 33 is controlled by a speed controlling closed loop circuit. In other words, the DC motor is controlled in such a manner that torque is produced in correspondence to the load which, in this case, is determined by the length of the part of the support which is in line contact with the peeling bar 6, namely, the substrate peeling width. The torque thus produced drives the take-up pinch rolls 24 and 25. Therefore, the unexposed parts 8a of the photopolymerization compound layer together with the transparent support 4 are peeled off by a tensile force which is in proportion to the substrate peeling width.

As shown in FIG. 8, a preset number of pulses Ps corresponding to a preset take-up speed is compared with a pulse signal P produced in response to rotation of the rotary shaft of the DC motor 33 by a pulse encoder 31, and the result of this comparison is applied to an arithmetic unit 32 with which the motor 33 is controlled via amplifier 34. Arithmetic unit 32 is a PID control element that is a combination Proportional control, Integral control and Differential control. Such PID's are conventional and well known in the art.

The tensile force of the take-up pinch rolls 24 and 25 can be controlled not only by directly controlling the DC motor 13, but also by a method in which a powder clutch, inserted in the power transmission system between the motor and the pinch rolls 24 and 25, is controlled according to a peeling width detection signal.

In operation, the square substrate is conveyed obliquely at a constant speed by the conveying pinch rolls, as described above. In this operation, the length of the part of the square substrate which is in line contact with the peeling bar 23 is detected by a sensor. The detection signal is used to control the tensile force of the take-up pinch rolls 24 and 25.

Figure 9:
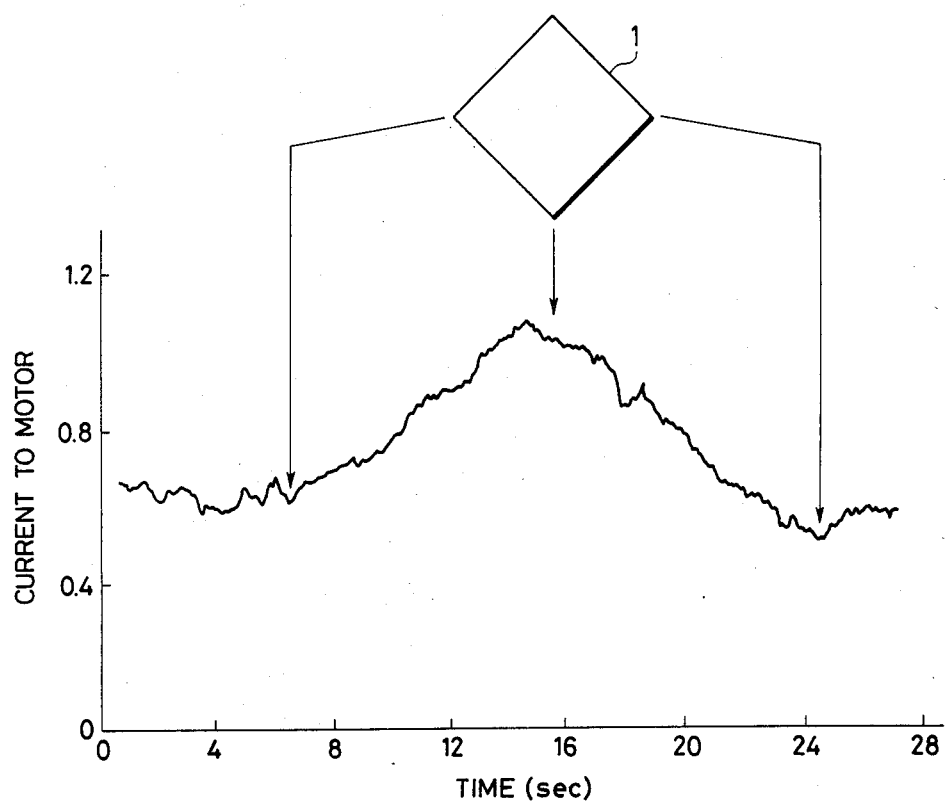
FIG. 9 is an explanatory diagram and a graph illustrating the relationship between a current supply to a motor for a pair of take-up pinch rolls and the width of substrate between the pinch rolls.

FIG. 9 shows the relationships between variations in the width of the transparent support 4 peeled from the square substrate 2 and currents supplied to the motor 33 for the take-up pinch rolls 24 and 25. As apparent from FIG. 9, the magnitude of the current changes in proportion to the peeling width, thereby maintaining constant the peeling force per unit length of the part being peeled off along the peeling bar 23.

Accordingly, the adhesive tape 7, the transparent support 4 and unexposed parts 3b of the photopolymerization compound layer are smoothly peeled off along the peeling bar 23 beginning with the top corner of the substrate. Thus, the peeling type developing operation has been accomplished.

The peeling force per unit length of the part of the transparent support 4 which is peeled off is constant, as described above. Therefore, a through-hole substrate manufactured according to the tenting method is, according to the invention, free from the difficulty of the exposed parts of the photopolymerization compound layer having the tented through-holes peeled off together with the transparent support.

As is apparent from the above description, according to the invention, the tensile force of the take-up pinch rolls employed to peel off the transparent support of the image forming material along the peeling bar is controlled according to the peeling width of the support. Therefore, the peeling force per unit length of the part of the support which is peeled off along the peeling bar is maintained constant. Accordingly, even though the peeling width of the support varies, the support is peeled off while being kept in contact with the peeling bar. Accordingly, with the square substrate conveyed obliquely, the peeling operation is free from "chattering".

Figure 11:
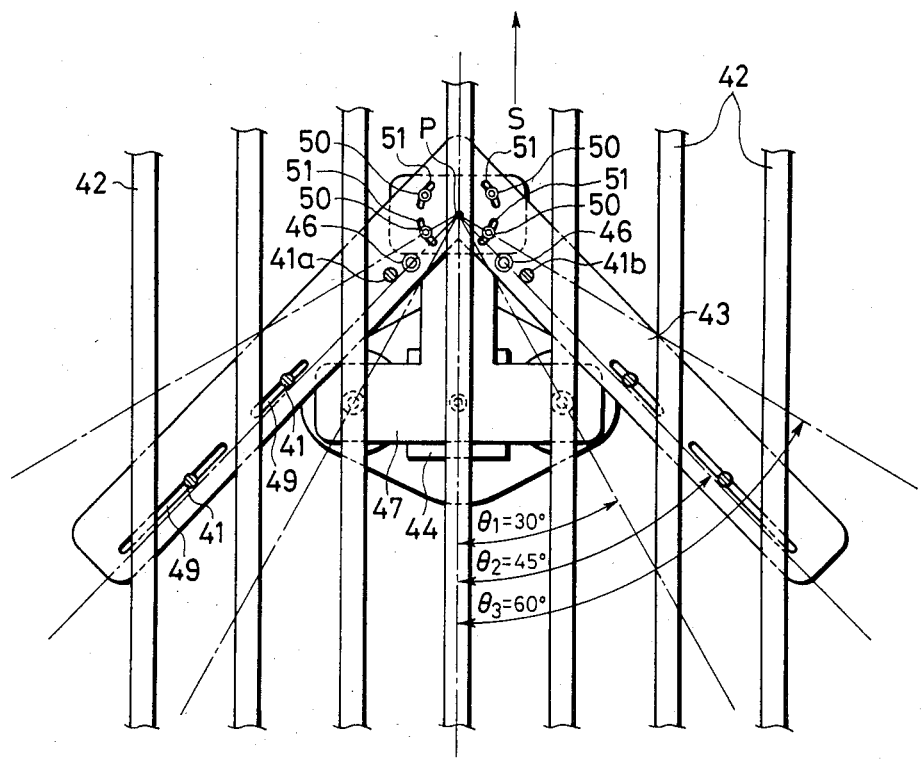
FIG. 11 is a plan view of an apparatus for aligning printed circuit boards on a conveyor for conveying them to the apparatus of FIG. 4.
Figure 12:
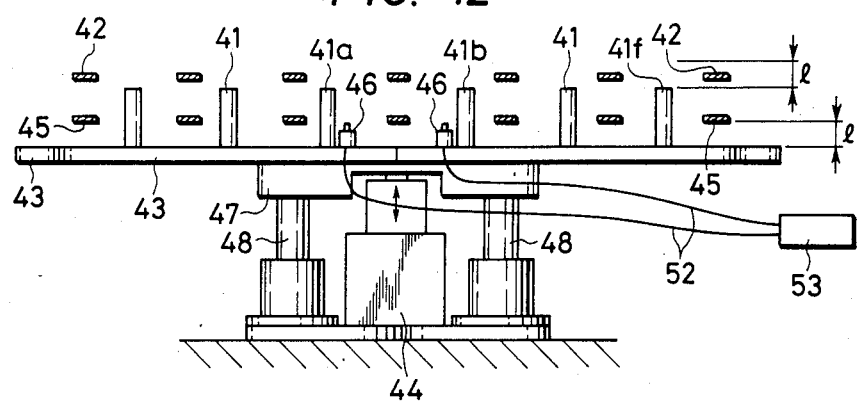
FIG. 12 is a side view of the apparatus of FIG. 11.
Figure 13:
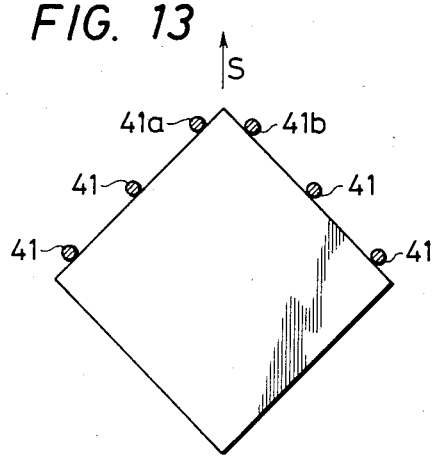
FIGS. 13 and 14 depict printed circuit boards aligned by the apparatus of FIGS. 11 and 12.
Figure 14:
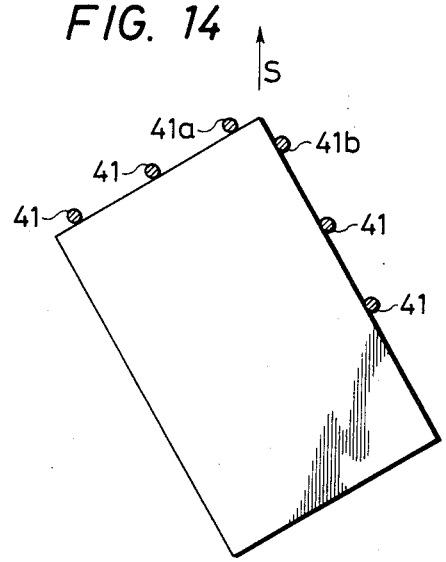

Referring now to FIGS. 11 and 12, an apparatus for conveying the workpiece obliquely to the nip formed between the conveying pinch rolls 21 and 22 will be described.

The conveyor system includes a plurality of parallel and spaced conveyor belts 42. Under and at the center of the assembly of conveyor belts 42 is positioned a V-shaped bar 3 lying in a plane parallel to the upper surface of the conveyor belts 42 and below the return sides 45 of the belts 42. A plurality of pins 41 are fixed to the plate 43, the pins 41 being mounted in slots 49 so that the positions of the pins 41 can be suitably adjusted. Preferably, the two arms of the bar 43 are adjustable around a center point P so that the interior angle of the bar 43 can be adjusted through an angular range of 30° to 60°. For this purpose, accurate slots 51 are formed in the two arms of the bar V. To adjust the angular position of the arms of the bar V, bolts 50, which secure the arms of the bar 43 to a block 47, are loosened, the arms adjusted, and then the bolts 50 retightened.

The block 47 is adjustable in the vertical direction by operation of a pneumatic cylinder 44 while being guided by guide posts 48.

A pair of sensors 46 are provided adjacent to pins 41a and 41b on opposite sides of the pivot point P of the bar 43. The sensors 46 are connected to a control circuit 53 via lead wires 52.

In operation, a printed circuit board is placed upon the upper surface of the conveyor belts 42, and thereby conveyed towards the plate 43. At this time, the pneumatic cylinder 44 is actuated to raise the bar 43 so that the upper ends of the pins 41 protrude above the upper surface of the conveyor belts 42. Thus, the conveyor belts 42 bring the printed circuit board into abutment with the pins 41. When the circuit board is oriented so that one corner thereof is near the point P and the two adjacent sides are in abutment with the pins 41, this fact is indicated by the sensors 46 to the control circuit 53. At that time, the pneumatic cylinder 44 is deactuated, thereby to lower the bar 43 and thus retract the pins 41 below the upper surface of the conveyor belts 42. Therefore, the printed circuit board is allowed to be conveyed by the conveyor belts 42 in the direction S indicated in FIG. 11.

As indicated in FIG. 12, the distance l through which the bar 43 is movable between the position at which the pins 41 protrude above the upper surface of the conveyor belts 42 and their retracted position should be less than the distance between the lower sides 42 of the conveyor belts 42 and the upper surface of the bar 42 in the retracted (lower) position of the bar 43.

With the arrangement shown in FIGS. 11 and 12, it is ensured that the printed circuit boards being conveyed to the nip of the pinch rolls 21 and 22 will be properly oriented automatically and without operator intervention.

This completes the description of the preferred embodiments of the invention. Although preferred embodiments have been described, it is believed that numerous modifications and alterations thereto would be apparent to one having ordinary skill in the art without departing from the spirit and scope of the invention.

We claim:

1. A peeling type developing device in which an image forming material layer comprising a transparent support and a photopolymerization compound layer formed thereon is formed on the surface of a rectangular substrate on which an image composed of exposed portions of said photopolymerization compound layer is to be formed, comprising: means for sticking an adhesive tape to said transparent support after said image forming material layer has been exposed in such a manner that said adhesive tape crosses opposite corners of said substrate; a pair of conveying pinch rolls for conveying said substrate obliquely; a peeling bar extending in a direction perpendicular to a direction of conveyance of said substrate; a pair of peeling pinch rolls for pulling said adhesive tape away from said substrate at a constant speed while moving said tape over said peeling bar with said peeling bar in line contact with said substrate through said adhesive tape and said picture forming material layer, whereby said adhesive tape, said support, and unexposed parts of said photopolymerization compound layer are peeled from said substrate, and exposed parts of said photopolymerization compound layer remain on said substrate.

2. The peeling type developing device of claim 1, further comprising separate motors for driving said conveying pinch rolls and said take-up pinch rolls, said motors being driven so that a speed ratio of a take-up speed imparted by said take-up pinch rolls to a conveying speed imparted by said conveying rolls is constant and in a range of 1.01 to 1.20.

3. The peeling type developing device of claim 2, wherein said ratio is in a range of 1.01 to 1.10.

4. A peeling type developing device in which an image forming material layer comprising a transparent support and a photopolymerization compound layer thereon is formed on a surface of a rectangular substrate on which an image composed of exposed portion of said photopolymerization layer is to be formed, comprising: means for sticking an adhesive tape to said transparent support after said image forming material layer has been exposed in such a manner that said adhesive tape crosses opposite corners of said substrate; a pair of conveying pinch rolls for conveying said substrate obliquely; a peeling bar extending in a direction perpendicular to a direction of conveyance of said substrate; a pair of peeling pinch rolls for pulling said adhesive tape away from said substrate at a constant speed while moving said tape over said peeling bar with said peeling bar in line contact with said substrate through said adhesive tape and said picture forming material layer, whereby said adhesive tape, said support, and unexposed parts of said photopolymerization compound layer are peeled from said substrate, and exposed parts of said photopolymerization compound layer remain on said substrate; peeling force control means comprising means for detecting a support peeling width equal to a length of a part of said transparent support in line contact with said peeling bar, and means for setting a tensile force of said pair of take-up pinch rolls exerted on said support according to said support peeling width.

5. The device as claimed in claim 4, wherein said peeling force control system comprises a DC motor for driving said take-up pinch rolls.

6. The device as claimed in claim 4, wherein said support peeling width detecting means comprises means for providing a detection signal representing said width, and arithmetic means operating in response to said detection signal for controlling said take-up pinch rolls.

7. The device as claimed in claim 4, wherein said support peeling force width detecting means comprises means for providing a detection signal representing said width, and wherein said peeling force control system comprises a powder clutch arranged in a power transmission system for said take-up pinch rolls, and means for applying a current proportional to said detection signal to control said peeling force.

* * * * *